United States Patent
Hikmet et al.

(10) Patent No.: US 9,803,809 B2
(45) Date of Patent: Oct. 31, 2017

(54) STABILIZED WAVELENGTH CONVERTING ELEMENT

(71) Applicant: PHILIPS LIGHTING HOLDING B.V., Eindhoven (NL)

(72) Inventors: Rifat Ata Mustafa Hikmet, Eindhoven (NL); Ties Van Bommel, Eindhoven (NL); Dirk Veldman, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 14/422,014

(22) PCT Filed: Aug. 7, 2013

(86) PCT No.: PCT/IB2013/056462
§ 371 (c)(1),
(2) Date: Feb. 17, 2015

(87) PCT Pub. No.: WO2014/030089
PCT Pub. Date: Feb. 27, 2014

(65) Prior Publication Data
US 2015/0219290 A1 Aug. 6, 2015

Related U.S. Application Data

(60) Provisional application No. 61/692,345, filed on Aug. 23, 2012.

(51) Int. Cl.
| | |
|---|---|
| *F21V 9/16* | (2006.01) |
| *F21K 99/00* | (2016.01) |
| *C09K 11/06* | (2006.01) |
| *H05B 33/14* | (2006.01) |
| *F21V 13/08* | (2006.01) |

(Continued)

(52) U.S. Cl.
CPC ............... *F21K 9/56* (2013.01); *C09K 11/06* (2013.01); *F21K 9/232* (2016.08); *F21K 9/61* (2016.08);
(Continued)

(58) Field of Classification Search
CPC ... F21K 9/56; F21K 9/232; F21K 9/61; F21K 9/64; C09K 11/06; C09K 2211/1011;
(Continued)

(56) References Cited

U.S. PATENT DOCUMENTS

| | | |
|---|---|---|
| 5,736,596 A | 4/1998 | Heitz et al. |
| 2005/0022865 A1 | 2/2005 | Robeson et al. |

(Continued)

FOREIGN PATENT DOCUMENTS

| | | |
|---|---|---|
| CN | 101010990A A | 8/2007 |
| CN | 104428907A A | 3/2015 |

(Continued)

*Primary Examiner* — Elmito Breval
*Assistant Examiner* — Hana Featherly

(57) ABSTRACT

A wavelength converting member is provided, comprising a wavelength converting layer comprising an organic wavelength converting compound distributed in a matrix comprising an amorphous or semi-crystalline aromatic polyester wherein the aromatic polyester molecules are predominantly in a randomly oriented state, said wavelength converting member further comprising at least one support element. By avoiding uniaxial or biaxial orientation of the polyester matrix, the organic wavelength converting compound (organic phosphor) is well protected against photo-chemical degradation. The support element ensures the dimensional stability of the polyester matrix at temperature above the glass transition temperature.

16 Claims, 2 Drawing Sheets

(51) Int. Cl.
    *F21K 9/232*    (2016.01)
    *F21K 9/61*     (2016.01)
    *F21K 9/64*     (2016.01)
    *H01L 33/50*    (2010.01)
    *F21Y 115/10*   (2016.01)

(52) U.S. Cl.
    CPC ............... *F21K 9/64* (2016.08); *F21V 9/16* (2013.01); *F21V 13/08* (2013.01); *H05B 33/14* (2013.01); *C09K 2211/1011* (2013.01); *F21Y 2115/10* (2016.08); *H01L 33/507* (2013.01)

(58) Field of Classification Search
    CPC ......... H01L 33/507; H05B 33/14; F21V 9/16; F21V 13/08; F21Y 2115/10
    USPC .......................................................... 362/84
    See application file for complete search history.

(56) References Cited

U.S. PATENT DOCUMENTS

2007/0290612 A1* 12/2007 Hama .................. H01L 27/322
                                                        313/506
2010/0084610 A1   4/2010 Iftime et al.
2011/0026240 A1*  2/2011 Hayashi ............... G02B 6/0065
                                                      362/97.1

FOREIGN PATENT DOCUMENTS

| EP | 0725119 A1 | 8/1996 |
| --- | --- | --- |
| EP | 1816178 A1 | 8/2007 |
| EP | 2487218 A1 | 8/2012 |
| EP | 2546901 A1 | 1/2013 |
| WO | WO2012029520A1 A1 | 3/2012 |
| WO | 2012042434 A1 | 4/2012 |
| WO | 2012045857 A1 | 4/2012 |

* cited by examiner

STABILIZED WAVELENGTH CONVERTING ELEMENT

CROSS-REFERENCE TO PRIOR APPLICATIONS

This application is the U.S. National Phase application under 35 U.S.C. §371 of International Application No. PCT/IB2013/056462, filed on Aug. 7, 2013, which claims the benefit of U.S. Patent Application No. 61/692345, filed on Aug. 23, 2012. These applications are hereby incorporated by reference herein.

FIELD OF THE INVENTION

The present invention relates to the field of solid state light emitting arrangement and in particular to organic phosphor elements used for wavelength conversion, in which an organic wavelength converting material (phosphor) is contained in a polymer matrix.

BACKGROUND OF THE INVENTION

Light-emitting diode (LED) based illumination devices are increasingly used for a wide variety of lighting applications. LEDs offer advantages over traditional light sources, such as incandescent and fluorescent lamps, including long lifetime, high lumen efficacy, low operating voltage and fast modulation of lumen output.

Efficient high-power LEDs are often based on blue light emitting materials. To produce an LED based illumination device having a desired color (e.g., white) output, a suitable wavelength converting material, commonly known as a phosphor, may be used which converts part of the light emitted by the LED into light of longer wavelengths so as to produce a combination of light having desired spectral characteristics. Many inorganic materials have been used as phosphor materials for converting blue light emitted by the LED into light of longer wavelengths. However, currently, organic phosphor materials are being considered for replacing inorganic phosphor in many LEDs. Organic phosphors have the advantage that their luminescence spectrum can be easily adjusted with respect to position and band width. Organic phosphor materials also often have a high degree of transparency, which is advantageous since the efficiency of the lighting system is improved compared to systems using more light-absorbing and/or reflecting phosphor materials. Furthermore, organic phosphors are much less costly than inorganic phosphors.

The main drawback hampering the application of organic phosphor materials in remote phosphor LED based lighting systems is their photo-chemical stability, which is poor. Organic phosphors have been observed to degrade quickly when illuminated with blue light in the presence of oxygen. Efforts have been made to solve this problem. For example, it has previously been found that when incorporating organic phosphors in an aromatic polyester film the lifetime of the phosphor is considerably improved. However, at operating temperatures around the glass transition temperature of an amorphous aromatic polyester the reduced dimensional stability of the polymer is a problem, which effectively limits the use of an organic phosphor in such a matrix to low intensity light source applications. To produce a phosphor film of sufficient dimensional stability the phosphor molecules may be mixed into an aromatic polyester matrix which is then biaxially oriented (stretched) and crystallized under stress, thus forming a crystalline or partly crystalline film with acceptable dimensional stability at temperatures well above the glass transition temperature of the polymer. However, it has been found that the photochemical stability of the organic phosphor is reduced in a biaxially oriented polymer as compared to the original amorphous or semi-crystalline polymer matrix. Furthermore, a biaxially oriented polymer shows a high optical transparency and addition of scattering particles is therefore necessary to achieve satisfactory outcoupling of light.

Thus, there is a need in the art for improvements with respect to the incorporation of sensitive phosphor materials in lighting devices.

SUMMARY OF THE INVENTION

It is an object of the present invention to overcome this problem, and to provide a wavelength converting element suitable for use in a solid state light emitting arrangement, which shows high dimensional stability and high photochemical stability of an organic phosphor.

According to a first aspect of the invention, this and other objects are achieved by a wavelength converting member comprising a wavelength converting layer comprising an organic wavelength converting compound distributed in a matrix comprising an amorphous or semi-crystalline aromatic polyester, wherein the aromatic polyester molecules are predominantly in a randomly oriented state, said wavelength converting member further comprising at least one support element. By avoiding uniaxial or biaxial orientation of the polyester matrix, the organic wavelength converting compound (organic phosphor) is well protected against photo-chemical degradation. The support element ensures the dimensional stability of the matrix also at temperatures around or above the glass transition temperature of the aromatic polyester.

In embodiments of the invention, the support element may comprise a reinforcement structure contained within said wavelength converting layer. Using such an internal reinforcement structure, the wavelength converting member may be formed of a single wavelength converting layer. For example, the support element may comprise reinforcement fibers.

In other embodiments, the support element may comprise at least one support layer or structure arranged in physical contact with said wavelength converting layer. The support layer or structure may be continuous or discontinuous. A continuous support layer may entirely cover one side of the wavelength converting layer, and may be made rather thin. A discontinuous support layer or structure typically leaves certain areas of the wavelength converting layer uncovered, e.g. having the shape of a frame, a ring, or a grid, and thus may be made thicker and with less regard to optical properties, at least when adapted for use in light emitting arrangements where the support is not positioned in the path of outgoing light.

In embodiments of the invention, the support element, e.g. the support layer or structure, may be transparent.

In embodiments of the invention, the support element, e.g. the support layer or structure, may be reflective or scattering.

In embodiments of the invention, the wavelength converting compound is a perylene derivative.

In embodiments of the invention, the amorphous or semi-crystalline aromatic polyester may comprise poly(ethylene terephthalate) (PET). Amorphous or semi-crystalline, non-stretched PET has been demonstrated to provide an excellent matrix for organic phosphor, such as perylene derivatives.

Typically, a semi-crystalline aromatic polyester used in embodiment of the invention may have a degree of crystallinity of less than 70%, preferably less than 50%, more preferably less than 30%, for example less than 20%. Such crystallinity may be achieved by thermal annealing, and does not significantly reduce the lifetime of the phosphor.

In another aspect, the invention provides a light emitting arrangement, comprising
- a solid state light source adapted to emit light of a first wavelength range; and
- a wavelength converting member as described above, arranged to receive light of said first wavelength range, the wavelength converting compound being adapted to convert at least a part of the light of said first wavelength range into light of a second wavelength range. The light source may be a medium or high power (medium or high intensity) solid state light source, such as a light emitting diode (LED) or a laser diode. As described above, the wavelength converting element is dimensionally stable also at operating temperatures of high intensity LEDs, where the operating temperature may exceed the glass transition temperature of the aromatic polyester.

In embodiments of the invention, the support element may comprise a supporting structure arranged in contact with the wavelength converting layer and arranged out of the path of light from said light source to said wavelength converting layer. In such embodiments, the support element may thus be designed with less regard to optical properties. In other embodiments, the support element may comprise a continuous transparent layer arranged in physical and optical contact with the wavelength converting layer, and in optical contact with the solid state light source, and wherein the support element functions as a light guide.

In a further aspect, the invention provides a lamp or a luminaire comprising a wavelength converting member according or a light emitting arrangement, respectively, as described above. For example, the lamp may be an incandescent bulb replacement lamp ("retrofit lamp").

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

The present inventors have found that as a result of uniaxial or biaxial stretching of the aromatic polyester film, the photochemical stability of the organic phosphor contained within the film is significantly decreased, compared to the stability of the organic phosphor contained within an amorphous or semi-crystalline aromatic polyester that is not uniaxially or biaxially stretched. This at least partly removes the advantage of using aromatic polyesters, such as poly (ethylene terephthalate) as a matrix for the organic phosphor. For example, the present inventors found that a luminescent molecule F305 (BASF) in a PET matrix (weight content of 0.002-0.015 wt %) under illumination by either yellow (0.1 W/cm$^2$) or blue (5 W/cm$^2$) light at 60° C. degraded at a rate more than five times higher for a biaxially stretched PET film compared to the un-stretched state.

Furthermore, it has now been found that an amorphous or semi-crystalline aromatic polyester film, such as poly(ethylene terephthalate) (PET), and copolymers thereof, and poly(ethylene naphthalate) (PEN), in which the aromatic polyester molecules are predominantly randomly oriented, can be stabilized using a support member, which may be an external layer or structure, or an internal reinforcement structure, such as reinforcement fibers, contained within the polyester matrix. As a result, a wavelength converting member having good structural stability as well long phosphor life time is provided.

Figure 1:
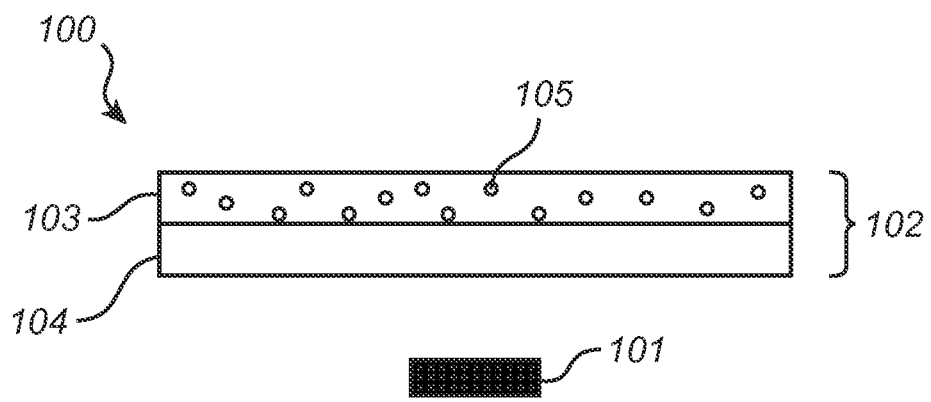
FIG. 1 shows a cross-sectional side view of a light emitting arrangement comprising a wavelength converting member with a continuous support layer, according to embodiments of the invention.

FIG. 1 illustrates a light emitting arrangement 100 comprising a solid state light source 101 and a wavelength converting member 102 arranged to receive light emitted by the light source. The wavelength converting member comprises an organic wavelength converting compound 105, referred to as an organic phosphor, dispersed in a matrix of an amorphous or semi-crystalline aromatic polyester, for example poly(ethylene terephthalate), forming a wavelength converting layer 103. Typically, the organic wavelength converting material may be molecularly dissolved in the aromatic polyester. The wavelength converting member 102 further comprises a support layer 104, providing structural stability to the polymer layer. Hence, the wavelength converting member comprising an amorphous or semi-crystalline aromatic polyester has sufficient dimensional stability at temperatures above the glass transition temperature, which for PET is about 75° C., to allow use of the wavelength converting member also in high intensity light emitting arrangements, where the temperature of the wavelength converting member can be above 70° C. during operation. Hence, in embodiments of the invention, the light source may be medium to high intensity solid state light source, for example an LED lamp or module delivering more than 500 lumens where the light intensity on the surface of the wavelength converting member is of the order of 0.1 W/cm$^2$.

By "semi-crystalline", referring to a polymer, is meant that the polymer comprises crystalline regions, i.e. it is not 100% amorphous. The semi-crystalline film according to embodiments of the invention typically has less than 70% crystallinity (by volume), meaning the crystalline phase of the polymer film constitutes less than 70% by volume of the film.

For example, the aromatic polyester matrix according to embodiments of the invention may have a degree of crystallinity of less than 50%, preferably less than 30%, for instance less than 20%, such as about 10% crystallinity. Crystallinity of polymers can be determined by or more of the techniques below which are well described in literature: density measurements, calorimetry, X-ray diffraction, IR spectroscopy, nuclear magnetic resonance spectroscopy.

According to embodiments of the present invention, the amorphous or semi-crystalline polymer used has not been subjected to stretching and therefore has no or only very minor degree of uniaxial or biaxial orientation. Typically, the orientation of the aromatic polyester molecules of the matrix is mainly random.

In embodiments of the invention, the support layer 104 may be at least partially transparent or translucent.

The support layer 104 may be made of any suitable material having sufficient dimensional stability at the operating temperature of the light source. For example, the support layer may be a polymer layer comprising a polymer such as crystalline PET (CPET) or heat-stabilized biaxially oriented PET (BOPET). Other examples of polymers include but are not limited to polycarbonate (PC), polyethylene naphthalate (PEN), poly(methyl methacrylate) (PMMA), nylon, and co-polymers thereof. Other examples are crosslinked polymer systems such as epoxies or acrylates. Alternatively, the support layer may be a glass plate or a translucent ceramic plate. When operating in so-called reflective mode, the support layer may be a reflective polymer, metal or ceramic plate.

The support layer 104 may be provided as a substrate onto which the wavelength converting layer is applied, or alternatively the support layer 104 may be provided as a coating on to wavelength converting layer 103. Such a coating may be applied by screen-printing, knife-coating, blade-coating or any other suitable coating technique known in the art. The wavelength converting layer 103 and the support layer 104 may be laminated.

As illustrated in the FIG. 1, the wavelength converting member 102 and the light source 101 are typically arranged mutually spaced apart, i.e. so-called remote phosphor configuration. It is however envisaged that the wavelength converting member could be arranged very close to the light source, so-called vicinity configuration, or in direct contact with the light source. Additionally, the wavelength converting member could be arranged in so-called reflective mode, in which a remote or vicinity phosphor is provided on a reflective element which reflects the converted light in a light output direction. In embodiments of the invention, the support layer 104 may be a reflective support layer in a reflective mode configuration. The light source is typically a solid state light source, such as a light emitting diode (LED) or a laser diode.

The wavelength converting member may have any suitable dimensions, depending on the intended application. As an example however, the wavelength converting layer may have a thickness in the range of from 0.05 mm to 0.4 mm, such as from 0.05 to 0.3 mm, e.g. 0.2 mm. Similarly, the support layer may have a thickness in the range of from 0.05 mm to 0.4 mm, such as from 0.1 to 0.3 mm, e.g. 0.2 mm.

The wavelength converting member may have a flat shape, or alternatively another shape, e.g. curved. For example, the wavelength converting member may be curved to fit the interior surface of a protective dome or of a transparent tube surrounding one or more light sources.

In embodiments of the invention, the support layer may be reflective, in which case the wavelength converting member is typically positioned with the wavelength converting layer facing towards the light source, such that light emitted by the light source is first received by the wavelength converting layer, where it is at least partially converted, and is subsequently reflected by the reflective support layer. Such an arrangement is usually referred to as "reflective mode".

Figure 2:
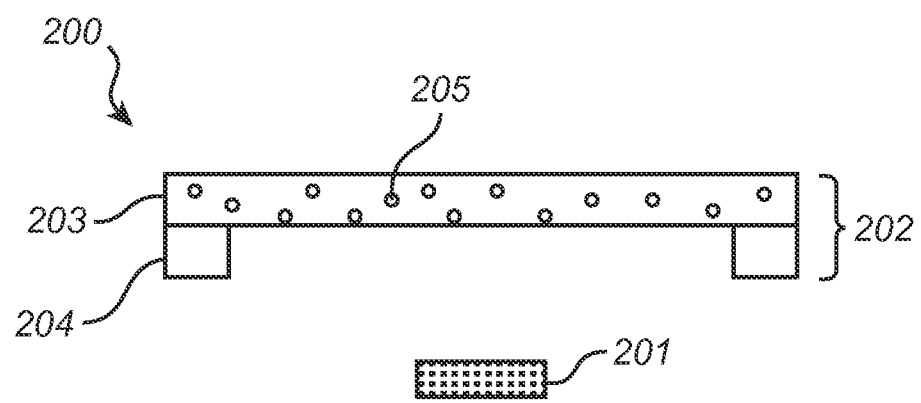
FIG. 2 shows a cross-sectional side view of a light emitting arrangement comprising a wavelength converting member with a discontinuous support layer, according to other embodiments of the invention.

In a further embodiment of the invention, illustrated in FIG. 2, a light emitting arrangement 200 comprises a light source 201 and a wavelength converting member 202 comprising a wavelength converting layer 203 and a discontinuous support structure 204. For example, the support structure 204 may be a grid structure, or a structure following the circumference of the wavelength converting layer. In such embodiments, the wavelength converting member and the light source may be positioned such that the support structure 204 is out of the path of light from the light source to the wavelength converting layer, as shown in the figure.

In embodiments of the invention, the wavelength converting member may comprise additional elements distributed in the polymer matrix, for example additional organic phosphors, one or more inorganic phosphors, and/or scattering elements such as particles of $TiO_2$, $Al_2O_3$ or $BaSO_4$. In embodiments of the invention, the support layer may comprise such scattering particles, and/or one or more inorganic phosphor(s) or quantum dots.

Figure 3:
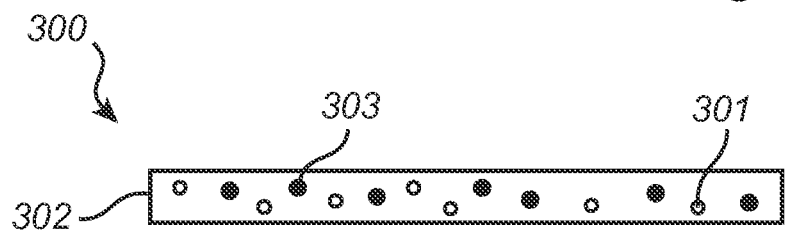
FIG. 3 shows cross-sectional side view of a wavelength converting member comprising an internal support element, according to embodiments of the invention.

In a further embodiment of a wavelength converting member 300, shown in FIG. 3, the support member may be provided in the form of an internal reinforcement structure 303 comprised within a wavelength converting layer 302. The wavelength converting layer also comprises the wavelength converting compound 301. For example, the internal reinforcement structure 303 may be fibers, for example fibers of glass, or of oriented polymers, such as ultrahigh molecular weight polyethylene (UHMWPE) or polyamide. Alternatively the internal reinforcement structure may be a grid, e.g. a metal grid.

Figure 4:
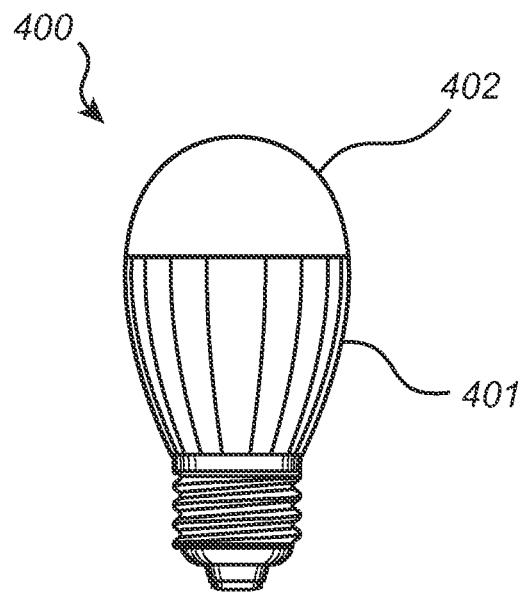
FIG. 4 is a side view showing an incandescent bulb replacement lamp ("retrofit lamp") comprising a wavelength converting member according to embodiments of the invention.

The wavelength converting member and the light emitting arrangement according to embodiments of the invention may be applicable in various lighting solutions. For example, FIG. 4 illustrates a so-called retrofit lamp, intended for replacement of incandescent bulbs. The lamp 400 is an LED based lamp provided with a base 401 adapted for a conventional bulb socket, and a bulb-shaped or dome-shaped transparent cover member 402. One or more light sources are arranged on the flat, upper surface of the base and are thus covered by the cover member. The wavelength converting member according to embodiments of the invention may be positioned at any suitable location within the space enclosed by the cover, for example on the inner side of the cover member.

In another embodiment, the wavelength converting member and the light emitting arrangement according to embodiments of the invention may be used in a TL (luminescent tube) replacement lamp, which typically comprises a plurality of LEDs arranged in a row on a support strip and enclosed by an at least partially transparent tube. The wavelength converting member according to embodiments of the invention may be positioned at any suitable location within the tube, for example on a part of the inner side of the transparent tube.

Other uses of the wavelength converting member and the light emitting arrangement according to embodiments of the invention include LED modules which may be applied in numerous lighting applications, including luminaires, such as suspended luminaires for lighting of home or professional environments.

Figure 5:
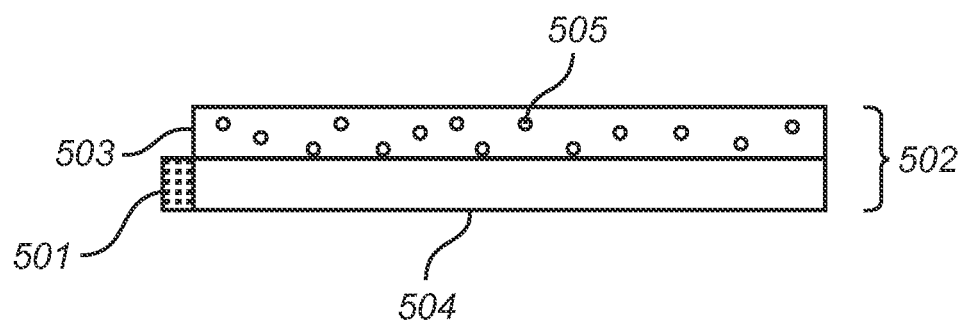
FIG. 5 shows a cross-sectional side view of a light emitting arrangement, including a support element having the function of a waveguide, according to another embodiment of the invention.

In yet another embodiment of a light emitting arrangement according to the invention, a support layer may also have the function of a light guide. An example of such an embodiment is shown in FIG. 5. The light emitting arrangement 500 comprises a light source 501 and a wavelength converting member 502 arranged in a so-called side-lit configuration. The wavelength converting member comprises a continuous, transparent support layer 504 arranged in optical contact with the wavelength converting layer 503 via its upper surface, and in optical contact with the light source via a lateral surface. The transparent support layer 504 may guide light emitted by the light source by total internal reflection until outcoupled and transmitted into the wavelength converting layer 503.

In embodiments of the invention, the wavelength converting layer 102, 202, 302, 502 comprises at least one organic phosphor. Examples of suitable organic phosphors are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

Examples of inorganic wavelength converting materials that may be used in combination with the organic phosphor(s) in the wavelength converting member include quantum dots or quantum rods. Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with shell such as cadmium sulfide (CdS) and zinc sulfide (ZnS). Cadmium free quantum dots such as indium phosphode (InP), and copper indium sulfide ($CuInS_2$) and/or silver indium sulfide ($AgInS_2$) can also be used. Quantum dots show very narrow emission band and thus they show saturated colors. Furthermore the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having a very low cadmium content.

Alternatively, an inorganic wavelength converting compound used in the present invention may be a conventional inorganic phosphor. Examples of inorganic phosphor materials include, but are not limited to, cerium (Ce) doped YAG ($Y_3Al_5O_{12}$) or LuAG ($Lu_3Al_5O_{12}$). Ce doped YAG emits yellowish light, whereas Ce doped LuAG emits yellow-greenish light. Examples of other inorganic phosphors materials which emit red light may include, but are not limited to ECAS and BSSN; ECAS being $Ca_{1-x}AlSiN_3:Eu_x$ wherein $0<x\leq1$, preferably $0<x\leq0.2$; and BSSN being $Ba_{2-x-z}M_xSi_{5-y}Al_yN_{8-y}O_y:Eu_x$ wherein M represents Sr or Ca, $0\leq x\leq1$, $0\leq y\leq4$, and $0.0005\leq z\leq0.05$, and preferably $0\leq x\leq0.2$.

The light source used in light emitting arrangements, lamps and luminaires according to embodiments of the invention may be LEDs, UV LEDs or laser diodes, but other light sources are equally conceivable. For instance, the LEDs may be flat-surface LED semiconductors chips, RGB LEDs, direct phosphor converted LEDs, or blue LEDs, violet LEDs, or UV LEDs combined with remote phosphor technology. The light-emitting surfaces may be uncoated, coated, etc.

The person skilled in the art realizes that the present invention by no means is limited to the preferred embodiments described above. On the contrary, many modifications and variations are possible within the scope of the appended claims. For example, the wavelength converting member described herein, including the support structure, may be used in optic and optoelectronic devices other than light emitting arrangements. For instance, the wavelength converting member may be used in a luminescent solar concentrator.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A wavelength converting member, comprising:
   at least one support element; and
   a wavelength converting layer disposed on the support element, the wavelength converting layer comprising,
   an organic phosphor containing wavelength converting compound distributed in a matrix, the matrix comprising amorphous or semi-crystalline aromatic polyester molecules,
   wherein the aromatic polyester molecules are predominantly in a randomly oriented state and are un-stretched to protect the organic phosphor against photo-chemical degradation.

2. The wavelength converting member according to claim 1, wherein the at least one support element comprises a reinforcement structure contained within the wavelength converting layer.

3. The wavelength converting member according to claim 2, wherein the support element comprises reinforcement fibers.

4. The wavelength converting member according to claim 1, wherein the at least one support element comprises at least one support layer or structure arranged in physical contact with the wavelength converting layer.

5. The wavelength converting member according to claim 4, wherein the support layer or structure is a continuous layer.

6. The wavelength converting member according to claim 4, wherein the support layer or structure is a discontinuous layer.

7. The wavelength converting member according to claim 1, wherein the at least one support element is transparent.

8. The wavelength converting member according to claim 1, wherein the at least one support element is reflective or scattering.

9. The wavelength converting member according to claim 1, wherein the organic phosphor containing wavelength converting compound is a perylene derivative.

10. The wavelength converting member according to claim 1, wherein the semicrystalline aromatic polyester comprises amorphous poly(ethylene terephthalate).

11. The wavelength converting member according to claim 1, wherein the semicrystalline aromatic polyester has a degree of crystallinity of less than 70%.

12. A light emitting arrangement, comprising:
- a solid state light source adapted to emit light of a first wavelength range; and
- a wavelength converting member according to claim 1 arranged to receive light of the first wavelength range, wherein the wavelength converting compound is arranged to convert at least a part of the light of the first wavelength range into light of a second wavelength range.

13. The light emitting arrangement according to claim 12, wherein the at least one support element comprises a supporting structure arranged in contact with the wavelength converting layer and arranged out of the path of light from the light source to the wavelength converting layer.

14. The light emitting arrangement according to claim 12, wherein the at least one support element comprises a continuous transparent layer arranged in physical and optical contact with the wavelength converting layer, and in optical contact with the solid state light source, and wherein the at least one support element functions as a light guide.

15. A lamp or luminaire comprising a light emitting arrangement according to claim 12.

16. A lamp or luminaire comprising a wavelength converting member according to claim 1.

* * * * *